United States Patent
Lan et al.

(10) Patent No.: US 11,362,244 B2
(45) Date of Patent: Jun. 14, 2022

(54) LIGHT-EMITTING DIODE DISPLAY

(71) Applicant: Au Optronics Corporation, Hsinchu (TW)

(72) Inventors: Yi-Fen Lan, Hsinchu (TW); Tsung-Tien Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 27 days.

(21) Appl. No.: 16/924,229

(22) Filed: Jul. 9, 2020

(65) Prior Publication Data
US 2021/0242377 A1 Aug. 5, 2021

(30) Foreign Application Priority Data
Feb. 3, 2020 (TW) ................................ 109103233

(51) Int. Cl.
| | |
|---|---|
| *H01L 33/60* | (2010.01) |
| *H01L 33/62* | (2010.01) |
| *H01L 33/58* | (2010.01) |
| *H01L 33/48* | (2010.01) |
| *H01L 25/16* | (2006.01) |
| *H01L 25/075* | (2006.01) |
| *H01L 27/15* | (2006.01) |

(52) U.S. Cl.
CPC .............. *H01L 33/60* (2013.01); *H01L 33/62* (2013.01)

(58) Field of Classification Search
CPC ............................. H01L 25/167; H01L 33/62
See application file for complete search history.

(56) References Cited

U.S. PATENT DOCUMENTS

| | | | |
|---|---|---|---|
| 2012/0326200 A1* | 12/2012 | Shen | H01L 33/62 |
| | | | 438/26 |
| 2019/0304960 A1* | 10/2019 | Ko | H01L 24/06 |
| 2020/0176508 A1* | 6/2020 | Wu | H01L 25/0753 |

FOREIGN PATENT DOCUMENTS

| | | |
|---|---|---|
| CN | 101276820 | 10/2008 |
| CN | 208460789 | 2/2019 |
| CN | 109920815 | 6/2019 |
| JP | 2017135301 | 8/2017 |
| KR | 20190029251 | 3/2019 |
| KR | 20190044449 | 4/2019 |
| KR | 20190069152 | 6/2019 |

(Continued)

*Primary Examiner* — Marcos D. Pizarro
*Assistant Examiner* — Antonio B Crite
(74) *Attorney, Agent, or Firm* — JCIPRNET

(57) ABSTRACT

A light-emitting diode display having sub-pixel regions is provided. Each of the sub-pixel region includes a substrate, first and second electrodes, a light-emitting diode, and at least one blocking wall. The substrate has an active device. The first and second electrodes are separately disposed on the substrate. The first electrode is electrically connected to the active device, and a horizontal distance between the first and second electrodes is W1. The light-emitting diode is disposed on the substrate and includes a semiconductor stack, and first and second pads. The first pad contacts the first electrode, the second pad contacts the second electrode, and a maximum thickness of the semiconductor stack is H1. The blocking wall is disposed on the substrate and located between the first and second pads to prevent a contact therebetween. A height of the blocking wall is H2 and a width thereof is W2. H2≤½H1, and W2≤W1.

10 Claims, 9 Drawing Sheets

(56) References Cited

FOREIGN PATENT DOCUMENTS

| KR | 20190077897 | 7/2019 |
|----|-------------|--------|
| KR | 20190086143 | 7/2019 |

* cited by examiner

LIGHT-EMITTING DIODE DISPLAY

CROSS-REFERENCE TO RELATED APPLICATION

This application claims the priority benefit of Taiwan application serial no. 109103233, filed on Feb. 3, 2020. The entirety of the above-mentioned patent application is hereby incorporated by reference herein and made a part of this specification.

BACKGROUND

Technical Field

The disclosure relates to a light-emitting diode display, and in particular relates to a light-emitting diode display having a blocking wall located between a first pad and a second pad.

Description of Related Art

As technology advances, the volume of many optoelectronic elements is gradually trending towards being miniaturized, and many problems are therefore to be addressed. Currently, in the field of light-emitting diode displays, the usual manufacturing process of bonding a flip-chip light-emitting diode to a substrate usually adopts melting two pads of the light-emitting diode and respectively connecting the pads to electrodes on the substrate, in a high temperature, high pressure environment. However, in the process of bonding miniaturized light-emitting diodes (e.g., micro light-emitting diodes) to the substrate, the two pads are frequently caused to be connected for reasons such as an overly close distance between the two adjacent pads on the micro light-emitting diode and a phenomenon of capillary action, which further results in a short circuit of the micro light-emitting diode bonded to the substrate.

SUMMARY

The disclosure provides a light-emitting diode display, which can prevent two pads on the light-emitting diode from connection when bonded to the substrate, and has greater reliability.

The light-emitting diode display of the disclosure has a plurality of sub-pixel regions. Each of the sub-pixel regions includes a substrate, a first electrode, a second electrode, a light-emitting diode, and at least one blocking wall. The substrate has an active device. The first electrode and the second electrode are separately disposed on the substrate. The first electrode is electrically connected to the active device, and a horizontal distance between the first electrode and the second electrode is W1. The light-emitting diode is disposed on the substrate, and includes a semiconductor stack, a first pad and a second pad. The first pad and second pad are separately disposed on the semiconductor stack. The first pad contacts the first electrode, the second pad contacts the second electrode, and a maximum thickness of the semiconductor stack is H1. The blocking wall is disposed on the substrate and is located between the first pad and the second pad to prevent a contact between the first pad and the second pad. A height of the blocking wall is H2 and a width of the blocking wall is W2. H2≤½H1, and W2≤W1.

In an embodiment of the disclosure, the blocking wall is located between the first electrode and the second electrode. An orthographic projection of the blocking wall on the substrate, an orthographic projection of the first electrode on the substrate, and an orthographic projection of the second electrode on the substrate do not overlap.

In an embodiment of the disclosure, the light-emitting diode display further includes at least one spacer. The spacer is disposed on at least one side of the light-emitting diode and located between adjacent ones of the sub-pixel regions. The spacer has reflective properties or absorptive properties.

In an embodiment of the disclosure, when the light-emitting diode display is viewed from above, a shape of the blocking wall includes a solid strip shape, a hollow rectangle, a hollow triangle, a V shape, a U shape, and a B shape.

In an embodiment of the disclosure, when the shape of the blocking wall is a solid strip shape, a length of the blocking wall is greater than a length of a short side of the light-emitting diode.

In an embodiment of the disclosure, when the shape of the blocking wall is a solid strip shape, a V shape, or a U shape, two ends of the blocking wall are located outside the light-emitting diode.

In an embodiment of the disclosure, when the shape of the blocking wall is a hollow rectangle or a hollow triangle, the blocking wall surrounds the first pad or the second pad.

In an embodiment of the disclosure, when the shape of the blocking wall is a V shape or a U shape, the blocking wall partially surrounds the first pad or the second pad.

In an embodiment of the disclosure, when the shape of the blocking wall is a B shape, the blocking wall includes a first hollow region and a second hollow region. The first pad is located in the first hollow region, and the second pad is located in the second hollow region.

In an embodiment of the disclosure, the at least one blocking wall is a plurality of blocking walls, and when the light-emitting diode display is viewed from above, a shape of each of the blocking walls includes a solid strip shape, a hollow rectangle, a hollow triangle, a V shape, and a U shape.

Based on the foregoing, in the light-emitting diode display of the embodiments of the disclosure, by disposing the blocking wall on the substrate and disposing the blocking wall between the first pad and the second pad, the first pad and the second pad on the light-emitting diode can be prevented from connection when bonded to the substrate which results in a short circuit. In this manner, the light-emitting diode display of the embodiments of the disclosure has greater reliability.

To make the aforementioned more comprehensible, several embodiments accompanied with drawings are described in detail as follows.

DESCRIPTION OF THE EMBODIMENTS

Figure 1A:
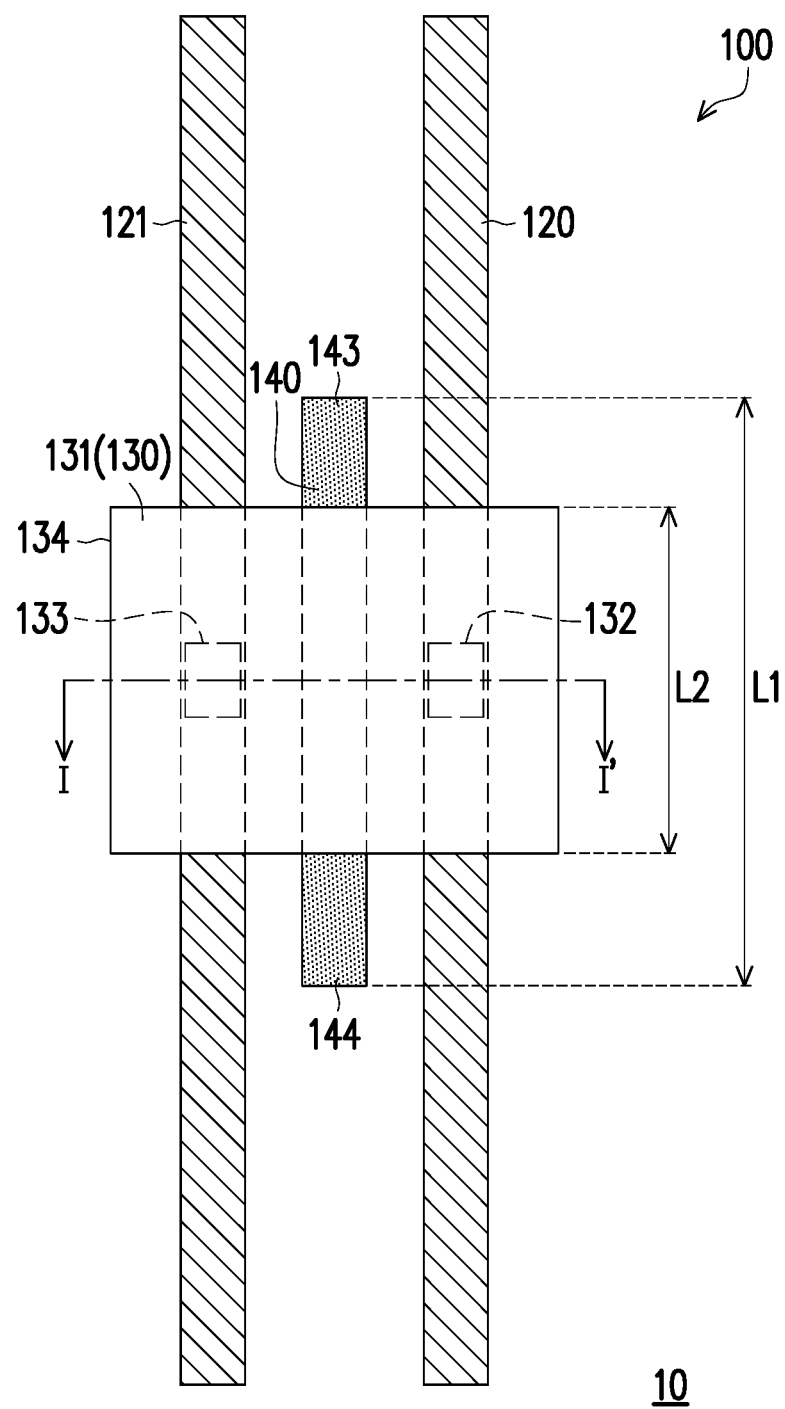
FIG. 1A is a schematic top view of a light-emitting diode display according to an embodiment of the disclosure.

Hereinafter the disclosure will be more comprehensively described with reference to the accompanying drawings and exemplary embodiments provided therein. As people skilled in the art will learn, the embodiments described herein may be modified in various manners without departing from the spirit or scope of the invention.

In the drawings, thicknesses of layers, films, panels, regions, etc., are exaggerated for the sake of clarity. Throughout the specification, the same elements are annotated using the same reference numerals. It should be understood that when an element such as a layer, film, region, or substrate is referred to as being "on", or "connected to" another element, it may be directly on or connected to said another element, or intermediate elements may also be present. In contrast, when an element is referred to as being "directly on" or "directly connected to" another element, no intermediate elements are present. As used herein, the term "connected" may refer to physical connection and/or electrical connection. Furthermore, "electrically connected" or "coupled" may encompass the presence of other elements between two elements.

It should be understood that although the terms "first", "second", "third", etc. may be used for describing various elements, components, regions, layers, and/or portions, the elements, components, regions, layers, and/or portions are not limited by these terms. These terms are only used for separating one element, component, region, layer, or portion from another element, component, region, layer, or portion. Therefore, the "first element", "component", "region", "layer", or "portion" discussed below may also be referred to as the second element, component, region, layer, or portion without departing from the teaching of the disclosure.

The terminology used herein is only for the purpose of describing specific embodiments and is not intended to be restrictive. As used herein, the singular forms "a", "an", and "the" are intended to cover the plural forms including "at least one" as well, unless the context clearly indicates otherwise. "or" represents "and/or". The term "and/or" used herein includes any one or all combinations of one or more of the relevant listed items. It will be further understood that the terms "comprise" and/or "include", when used herein, specifies the presence of the specified features, regions, entirety, steps, operations, elements, and/or components, but do not exclude the presence or addition of one or more other features, regions, entireties, steps, operations, elements, components, and/or combinations thereof.

Moreover, relative terms such as "lower" or "bottom" and "upper" or "top" may serve to describe the relation between one element and another element herein as shown in the drawings. It should be understood that the relative terms are intended to include different orientations of an element in addition to the orientation shown in the drawings. For instance, if a device in the drawings is turned upside down, an element described as being on the "lower" side of other elements shall be re-orientated to be on "upper" sides of the other elements. Thus, the exemplary term "lower" may include the orientations of "lower" and "upper", depending on the specific orientation of the drawings. Similarly, if a device in the drawings is turned upside down, an element described to be "below" or "beneath" other elements shall be re-oriented to be "above" said other elements. Therefore, the exemplary term "above" or "below" may include orientations of above and below.

Unless otherwise defined, all terms (including technical and scientific terms) used herein have the same meaning as commonly understood by people of ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless explicitly so defined herein.

Exemplary embodiments are described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but include deviations in shapes that result, for instance, from manufacturing. For instance, regions shown or described as being flat may typically have rough and/or non-linear features. Besides, the acute angle as shown may be round. Therefore, the regions shown in the drawings are schematic in nature, and their shapes are not intended to show the exact shapes of the regions, and are not intended to limit the scope of the claims.

Reference will now be made in detail to exemplary embodiments of the disclosure, examples of which are illustrated in the accompanying drawings. Wherever possible, the same element symbols are used in the drawings and description to denote the same or similar parts.

Figure 1B:
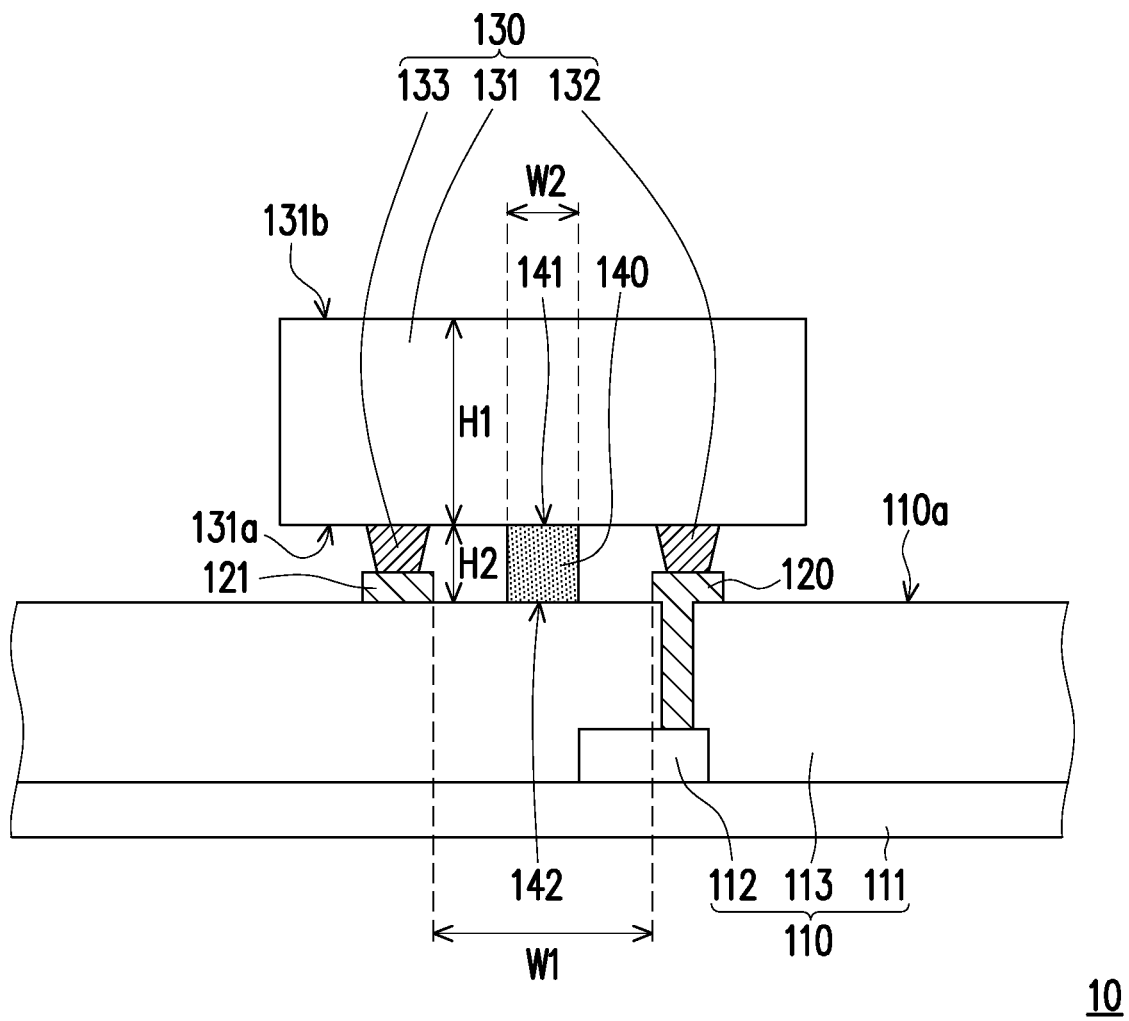
FIG. 1B is a schematic cross-sectional view of the light-emitting diode display of FIG. 1A along a section line I-I'.

FIG. 1A is a schematic top view of a light-emitting diode display according to an embodiment of the disclosure. FIG. 1B is a schematic cross-sectional view of the light-emitting diode display of FIG. 1A along a section line I-I'. For convenience of description, FIG. 1A omits the illustration of the substrate 110.

Refer to FIG. 1A and FIG. 1B at the same time, a light-emitting diode display 10 of this embodiment has a plurality of sub-pixel regions 100. Each of the sub-pixel regions 100 includes a substrate 110, a first electrode 120 and a second electrode 121, a light-emitting diode 130, and at least one blocking wall 140. The substrate 110 at least includes a base 111, an active device 112, and a dielectric layer 113. The active device 112 is disposed on the base 111. The dielectric layer 113 is disposed on the base 111, and the dielectric layer 113 covers the active device 112 and the base 111. In this embodiment, materials of the base 111 may be glass, quartz, organic polymer, or opaque/reflective materials (e.g., wafer, ceramic, or other applicable materials), or other applicable materials. In this embodiment, the dielectric layer 113 may be one single layer or multiple layers. Materials of the dielectric layer 113 may be organic materials or inorganic materials, such as silicon oxides or silicon nitrides, but are not limited thereto. In this embodiment, the types of the active device 112 include top-gate thin-film transistors, bottom-gate thin-film transistors, double-gate thin-film transistors, or other applicable thin-film transistors.

The first electrode 120 and the second electrode 121 are separately disposed above an upper surface 110a of the substrate 110. The first electrode 120 and the second electrode 121 are both located on the upper surface 110a of the substrate 110. The first electrode 120 is electrically connected to the active device 112, and a horizontal distance between the first electrode 120 and the second electrode 121 is W1. In this embodiment, at least one of the first electrode 120 and the second electrode 121 may be one single layer or multiple layers. The first electrode 120 and the second electrode 121 may be metal reflective layers, so that the light emitting direction of the light-emitting diode 130 is upward. The first electrode 120 and the second electrode 121 may be transparent conductive layers. Materials of the first electrode 120 and the second electrode 121 may be silver, gold, copper, tin, or other suitable conductive materials.

The light-emitting diode 130 is disposed above the upper surface 110a of the substrate 110. The light-emitting diode 130 includes a semiconductor stack 131, a first pad 132, and a second pad 133. The semiconductor stack 131 has a first surface 131a facing the substrate 110 and a second surface 131b opposite to the first surface 131a. The semiconductor stack 131 includes a first-type semiconductor layer, a light-emitting layer, and a second-type semiconductor layer (not shown). The light emitting layer is located between the first-type semiconductor layer and the second-type semiconductor layer. The first-type semiconductor layer and the second-type semiconductor layer respectively have different electrical properties. In this embodiment, the light-emitting diode 130 may be a micro light-emitting diode, and a length and a width of the light-emitting diode 130 may, for instance, be less than 1 mm. In addition, in this embodiment, the light-emitting diode 130 may be embodied as a flip-chip micro light-emitting diode, but is not limited thereto.

In this embodiment, the first pad 132 and the second pad 133 are separately disposed above the first surface 131a of the semiconductor stack 131. The first pad 132 directly contacts the first electrode 120 and is electrically connected to the first electrode 120. The second pad 133 directly contacts the second electrode 121 and is electrically connected to the second electrode 121. A maximum thickness of the semiconductor stack 131 is H1. The maximum thickness H1 of the semiconductor stack 131 may be a vertical distance between the first surface 131a and the second surface 131b of the semiconductor stack 131. In this embodiment, at least one of the first pad 132 and the second pad 133 may be one single layer or multiple layers. The first pad 132 and the second pad 133 may be transparent conductive layers. Materials of the first pad 132 and the second pad 133 may be silver, gold, copper, tin, or other suitable conductive materials.

The blocking wall 140 is disposed above the upper surface 110a of the substrate 110. The blocking wall 140 is located between the first pad 132 and the second pad 133 to prevent a contact between the first pad 132 and the second pad 133. The blocking wall 140 may also be located between the first electrode 120 and the second electrode 121. In some embodiments, an orthographic projection of the blocking wall 140 on the substrate 110, an orthographic projection of the first electrode 120 on the substrate 110, and an orthographic projection of the second electrode 121 on the substrate 110 do not overlap one another. In this embodiment, the blocking wall 140 may be one single layer or multiple layers. Materials of the blocking wall 140 may be organic materials or inorganic materials, such as silicon oxides or silicon nitrides, but are not limited thereto.

In this embodiment, the blocking wall 140 has a top surface 141 and a bottom surface 142 opposite to each other. The top surface 141 of the blocking wall 140 and the first surface 131a of the semiconductor stack 131 may be coplanar. That is to say, the top surface 141 of the blocking wall 140 may directly contact the semiconductor stack 131 of the light-emitting diode 130. The bottom surface 142 of the blocking wall 140 directly contacts the substrate 110. In addition, in this embodiment, a height of the blocking wall 140 is H2, and a width of the blocking wall 140 is W2. The height H2 of the blocking wall 140 may be a vertical distance between the top surface 141 and the bottom surface 142 of the blocking wall 140. In this embodiment, the height H2 of the blocking wall 140≤½ the maximum thickness H1 of the semiconductor stack 131, and the width W2 of the blocking wall 140≤ the horizontal distance W1 between the first electrode 120 and the second electrode 121. Namely, H2≤½H1 and W2≤W1.

Referring to FIG. 1A again, when the light-emitting diode display 10 of this embodiment is viewed from above, a shape of the blocking wall 140 may be embodied as a solid strip shape, and a length L1 of the blocking wall 140 is greater than a length L2 of a short side 134 of the light-emitting diode 130. In this embodiment, by disposing the blocking wall 140 between the first pad 132 and the second pad 133 to space the first pad 132 apart from the second pad 133, the adjacent first pad 132 and second pad 133, when bonded to the first electrode 120 and second electrode 121 on the substrate 110 (i.e., when the first pad 132 and second pad 133 are melted), can be prevented from connection for reasons such as an overly close distance and a phenomenon of capillary action.

In this embodiment, the blocking wall 140 is located between the first electrode 120 and the second electrode 121, and the blocking wall 140 is parallel to the short side 134 of the light-emitting diode 130. Also, two ends 143 and 144 of the blocking wall 140 extend beyond the light-emitting diode 130 along a direction parallel to the short side 134. That is to say, both ends 143 and 144 of the blocking wall 140 are outside the light-emitting diode 130, and orthographic projections of the two ends 143 and 144 of the blocking wall 140 on the substrate 110 do not overlap an orthographic projection of the light-emitting diode 130 on the substrate 110. Thereby, it is ensured that the first pad 132 and the second pad 133, when melted, do not flow past the two ends 143 and 144 of the blocking wall 140 to be connected to each other, so that a short circuit is prevented.

In this embodiment, although in FIG. 1A there is only one blocking wall 140, the shape of the blocking wall 140 is a solid strip shape, and the blocking wall 140 is disposed in a direction parallel to the short side 134 of the light-emitting diode 130, however, the number of the blocking wall, the shape of the blocking wall, and a direction of disposal of the blocking wall in the disclosure are not limited thereto, provided that the blocking wall 140 can be located between the first pad 132 and the second pad 133, and that the first pad 132 and the second pad 133, when melted, do not flow past the two ends 143 and 144 of the blocking wall 140 to be connected to each other, so that a short circuit is prevented.

Other exemplary embodiments will be described hereinafter. It should be noted that the following embodiments retain the element numerals and part of the contents in the foregoing embodiments. Herein, the same reference numerals are used to indicate the same or similar elements, and the description of the same technical contents is omitted. For the description of the omitted parts, reference may be made to the foregoing embodiments, and will not be repeatedly described in the following embodiments.

Figure 2A:
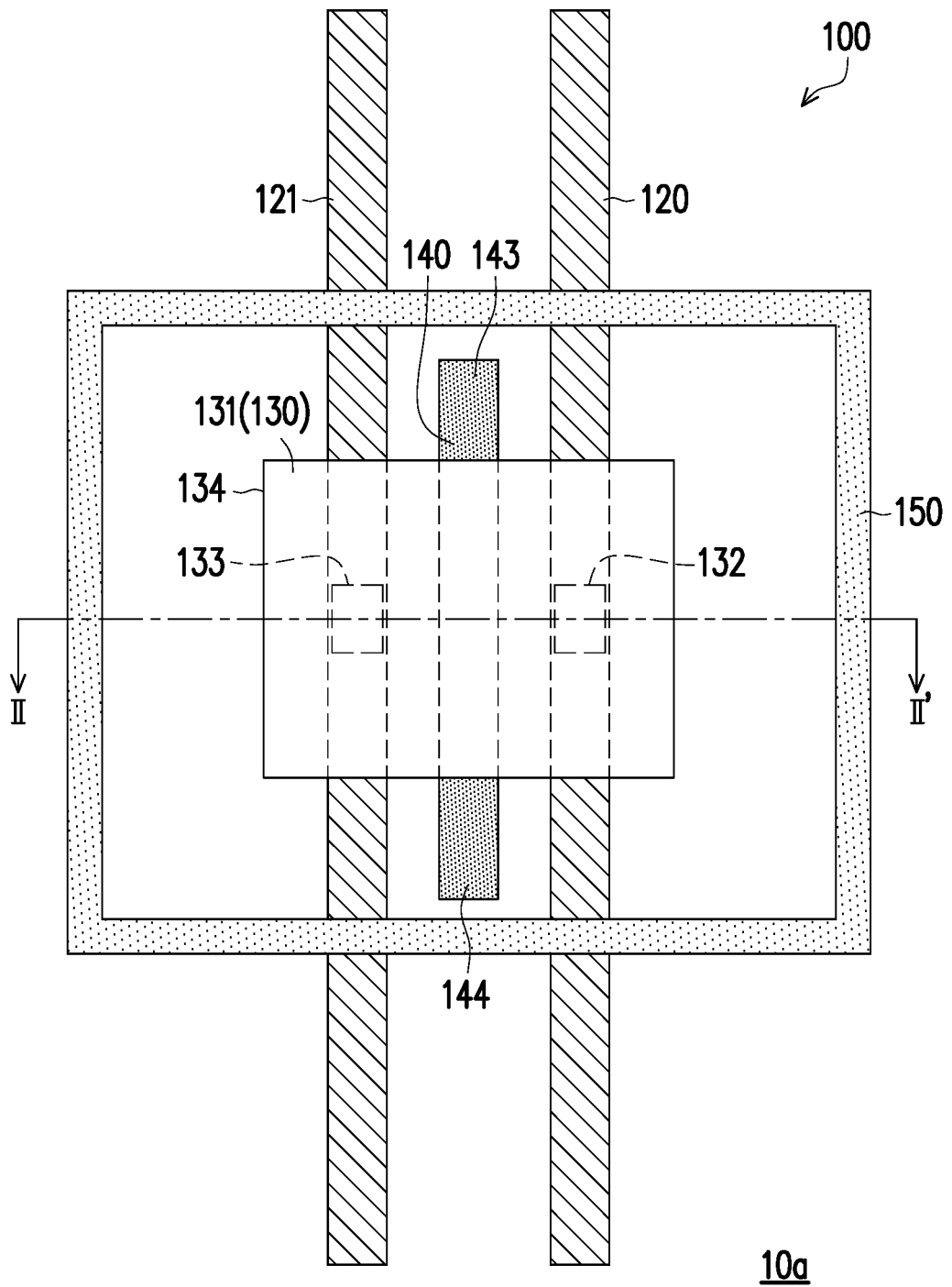
FIG. 2A is a schematic top view of a light-emitting diode display according to another embodiment of the disclosure.
Figure 2B:
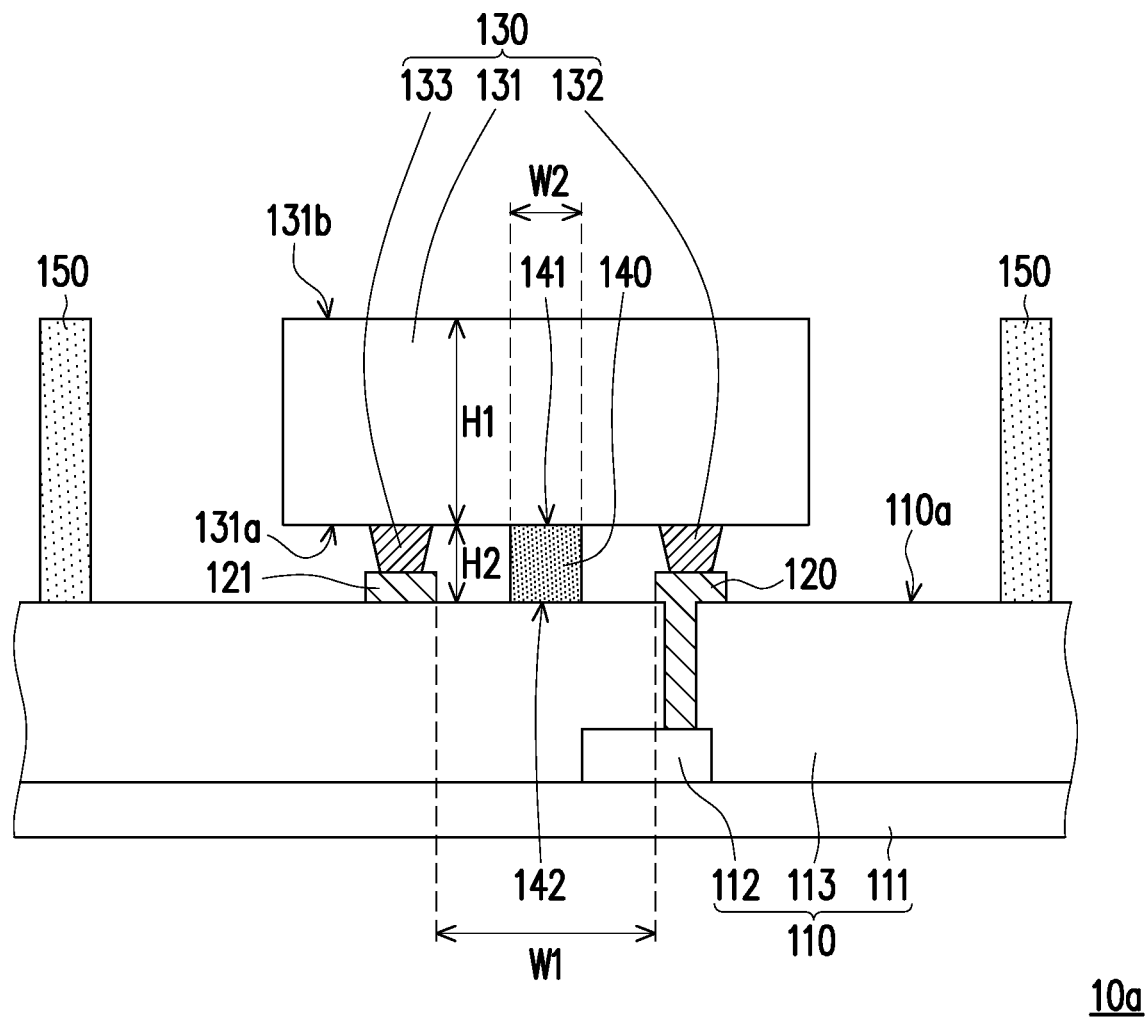
FIG. 2B is a schematic cross-sectional view of the light-emitting diode display of FIG. 2A along a section line II-II'.

FIG. 2A is a schematic top view of a light-emitting diode display according to another embodiment of the disclosure. FIG. 2B is a schematic cross-sectional view of the light-emitting diode display of FIG. 2A along a section line II-II'. Referring to FIG. 1A, FIG. 1B, FIG. 2A, and FIG. 2B at the same time, a light-emitting diode display 10a of this embodiment is similar to the light-emitting diode display 10 of FIG. 1A and FIG. 1B, only the main difference therebetween is that the light-emitting diode display 10a of this embodiment further includes at least one spacer 150. The spacer 150 is disposed on at least one side of the light-emitting diode 130 and is located between adjacent ones of the sub-pixel regions 100 to prevent light interference between the adjacent sub-pixel regions 100. In this embodiment, the spacer 150 may have reflective properties or absorptive properties. In addition, as shown in FIG. 2A, the spacer 150 may also surround on all sides of the light-emitting diode 130 to reflect or absorb light scattered by the light-emitting diode 130.

FIG. 3A to FIG. 3D are schematic top views of light-emitting diode displays according to various embodiments of the disclosure. FIG. 4A to FIG. 4E are schematic top views of light-emitting diode displays according to various embodiments of the disclosure. For convenience of description, illustrations of the substrate 110, the first electrode 120, and the second electrode 121 are omitted in FIG. 3A to FIG. 3D and FIG. 4A to FIG. 4E.

Figure 3A:
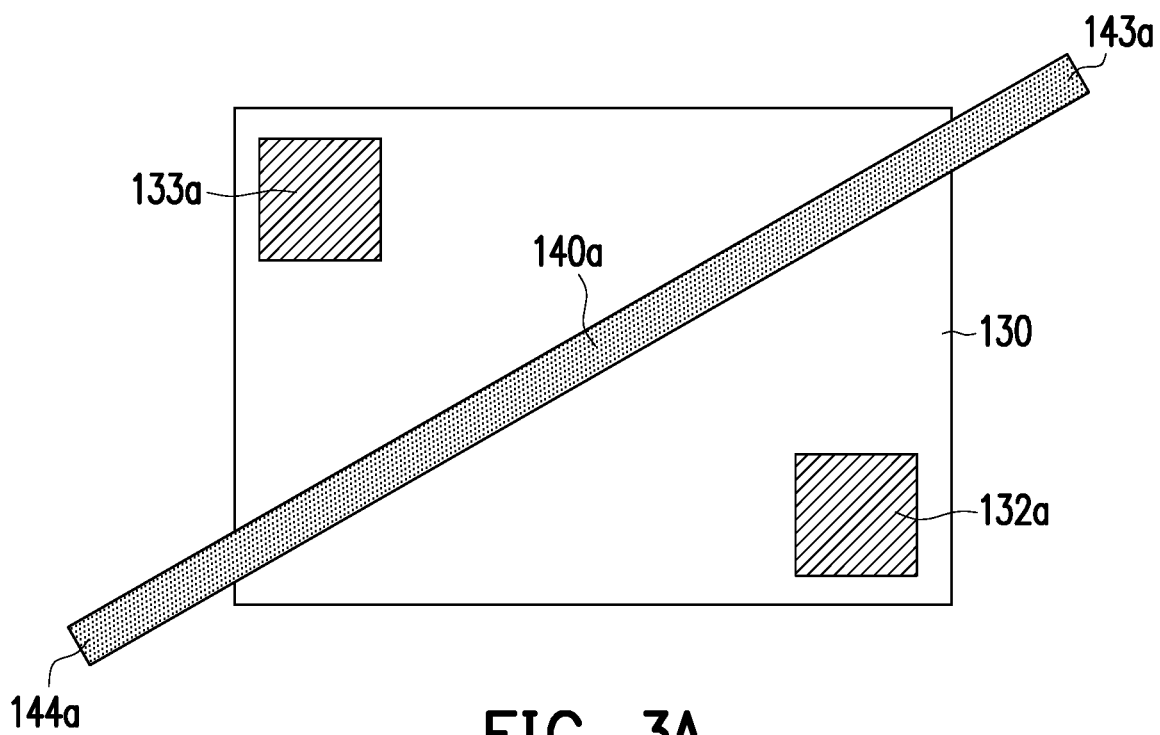
FIG. 3A to FIG. 3D are schematic top views of light-emitting diode displays according to various embodiments of the disclosure.

Referring to FIG. 3A, when viewed from above, a first pad 132a and a second pad 133a are respectively disposed at two opposite corners with regard to a diagonal line of the light-emitting diode 130. At this time, a shape of a blocking wall 140a may be embodied as a solid strip shape, and the blocking wall 140a is disposed along a direction of another diagonal line, the blocking wall 140a is located between the first pad 132a and the second pad 133a, and two ends 143a and 144a of the blocking wall 140a are located outside the light-emitting diode 130.

Figure 3B:
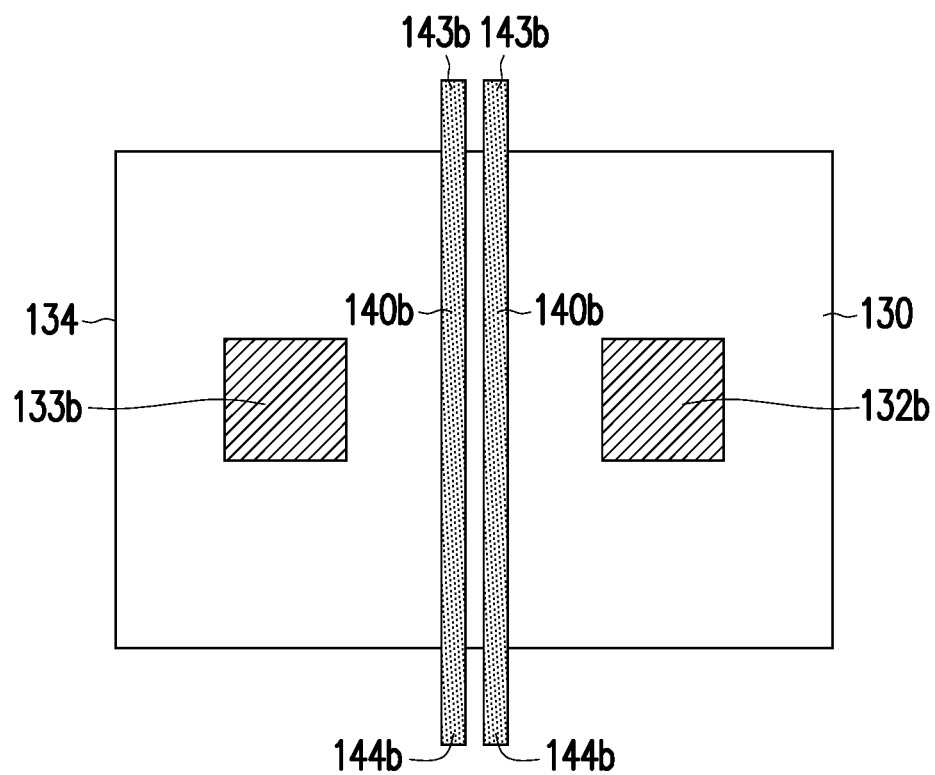

Referring to FIG. 3B, when viewed from above, shapes of two blocking walls 140b may be embodied as solid strip shapes, and both blocking walls 140b are disposed in a direction parallel to the short side 134 of the light-emitting diode 130, both blocking walls 140b are located between a first pad 132b and a second pad 133b and two ends 143b and 144b of both blocking walls 140b are located outside the light-emitting diode 130.

Figure 3C:
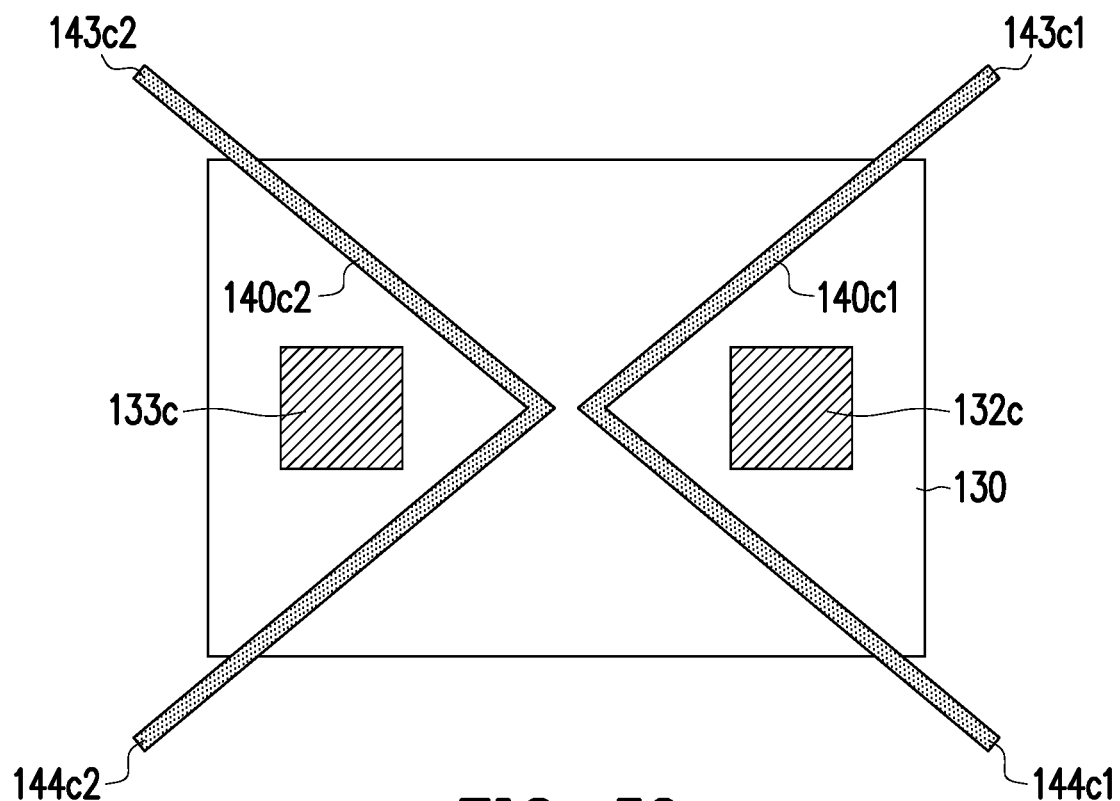

Referring to FIG. 3C, when viewed from above, shapes of two blocking walls 140c1 and 140c2 may be embodied as V shapes. Both blocking walls 140c1 and 140c2 are located between a first pad 132c and a second pad 133c. The blocking wall 140c1 partially surrounds the first pad 132c, and the blocking wall 140c2 partially surrounds the second pad 133c. Two ends 143c1 and 144c1 of the blocking wall 140c1 are located outside the light-emitting diode 130, and two ends 143c2 and 144c2 of the blocking wall 140c2 are located outside the light-emitting diode 130.

Figure 3D:
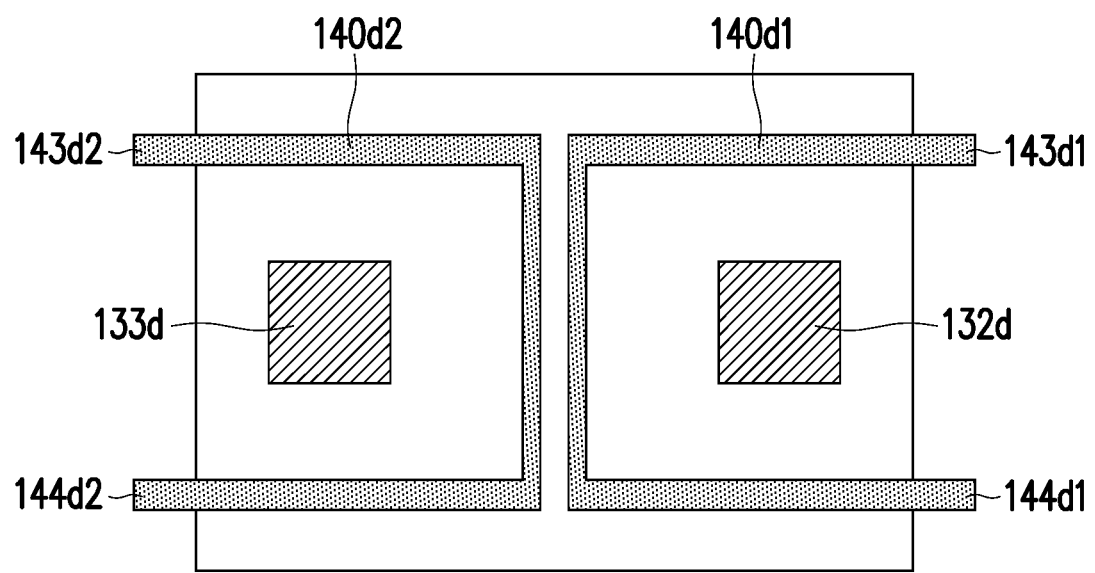

Referring to FIG. 3D, when viewed from above, shapes of two blocking walls 140d1 and 140d2 may be embodied as U shapes. Both blocking walls 140d1 and 140d2 are located between a first pad 132d and a second pad 133d. The blocking wall 140d1 partially surrounds the first pad 132d, and the blocking wall 140d2 partially surrounds the second pad 133d. Two ends 143d1 and 144d1 of the blocking wall 140d1 are located outside the light-emitting diode 130, and two ends 143d2 and 144d2 of the blocking wall 140d2 are located outside the light-emitting diode 130.

Figure 4A:
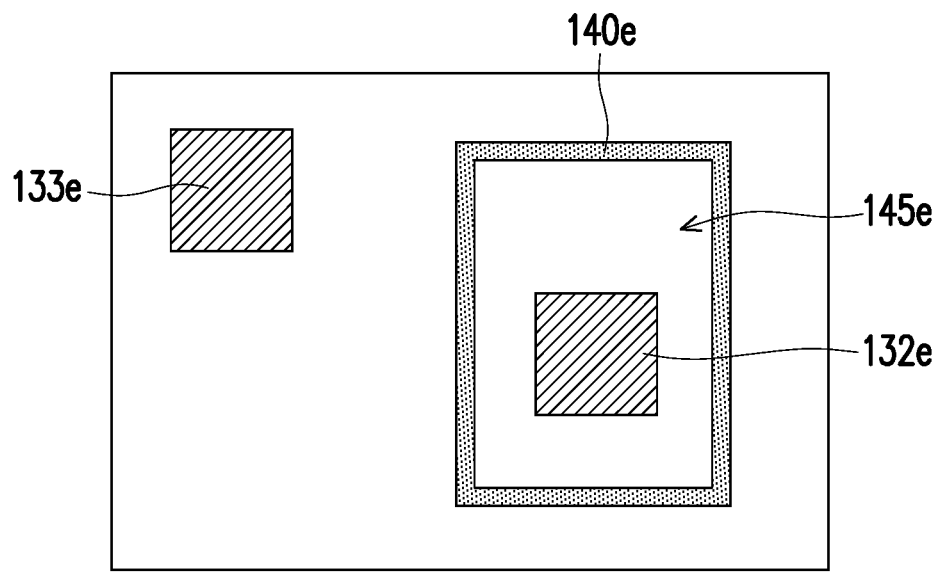
FIG. 4A to FIG. 4E are schematic top views of light-emitting diode displays according to various embodiments of the disclosure.

Referring to FIG. 4A, when viewed from above, a shape of a blocking wall 140e may be embodied as a hollow rectangle. The blocking wall 140e is located between a first pad 132e and a second pad 133e. The first pad 132e is located in a hollow region 145e of the blocking wall 140e, and the second pad 133e is located outside the blocking wall 140e. That is to say, the blocking wall 140e surrounds on all sides of the first pad 132e to completely surround the first pad 132e.

Figure 4B:
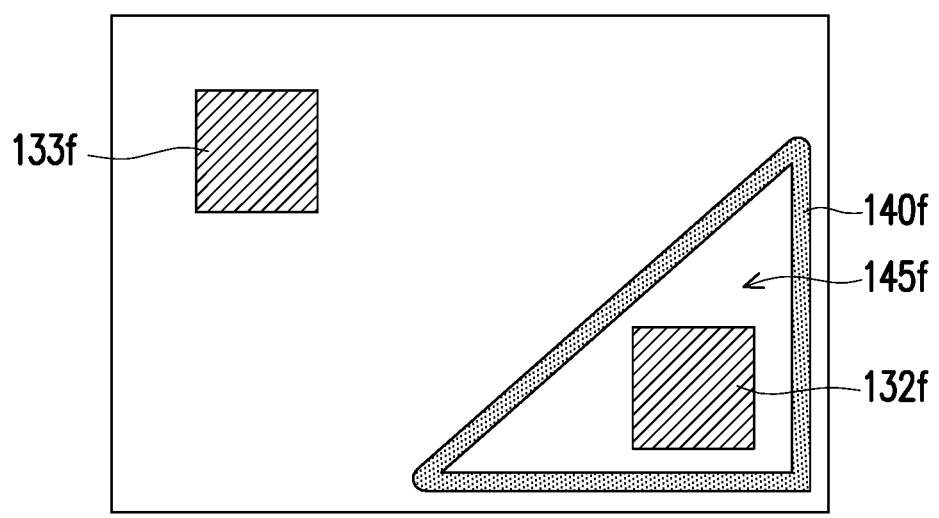

Referring to FIG. 4B, when viewed from above, a shape of the blocking wall 140f may be embodied as a hollow triangle. The blocking wall 140f is located between a first pad 132f and a second pad 133f. The first pad 132f is located in a hollow region 145f inside the blocking wall 140f, and the second pad 133f is located outside the blocking wall 140f. That is to say, the blocking wall 140f surrounds on all sides of the first pad 132f to completely surround the first pad 132f.

Figure 4C:
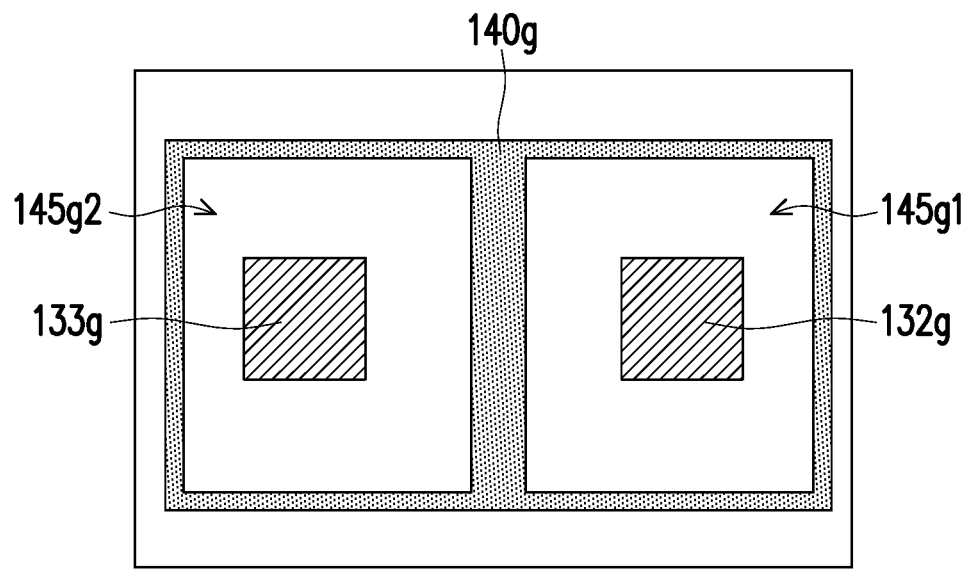

Referring to FIG. 4C, when viewed from above, a shape of the blocking wall 140g may be embodied as B shape, and the blocking wall 140g includes a first hollow region 145g1 and a second hollow region 145g2. The blocking wall 140g is located between a first pad 132g and a second pad 133g. The first pad 132g is located in the first hollow region 145g1 of the blocking wall 140g, and the second pad 133g is located in the second hollow region 145g2 of the blocking wall 140g. That is to say, the blocking wall 140g may separately surround the first pad 132g and the second pad 133g.

Figure 4D:
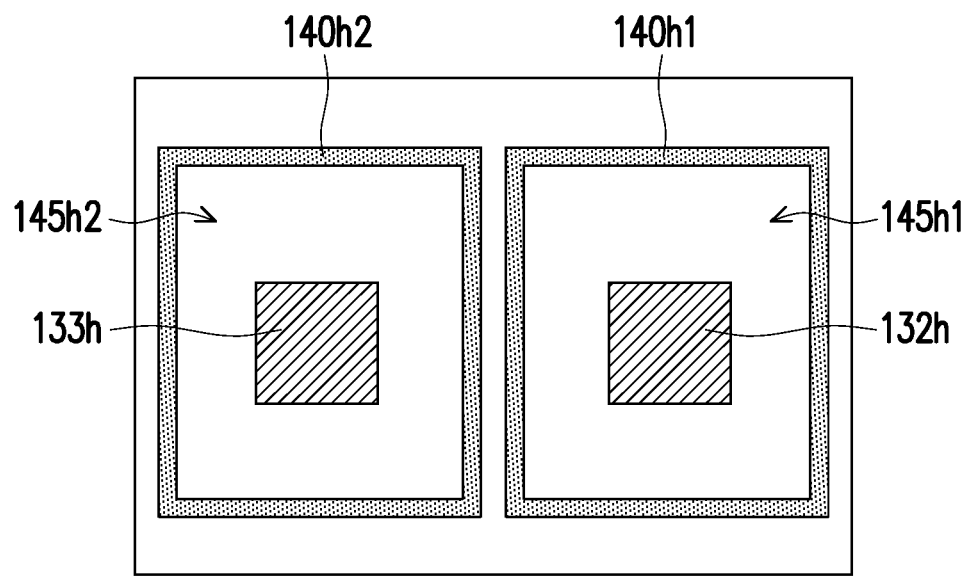

Referring to FIG. 4D, when viewed from above, shapes of two blocking walls 140h1 and 140h2 may be embodied as hollow rectangles. Both blocking walls 140h1 and 140h2 are located between a first pad 132h and a second pad 133h. The first pad 132h is located in a hollow region 145h1 of the blocking wall 140h1, and the second pad 133h is located in a hollow region 145h2 of the blocking wall 140h2. That is to say, the blocking wall 140h1 surrounds on all sides of the first pad 132h to completely surround the first pad 132h. The blocking wall 140h2 surrounds on all sides of the second pad 133h to completely surround the second pad 133h.

Figure 4E:
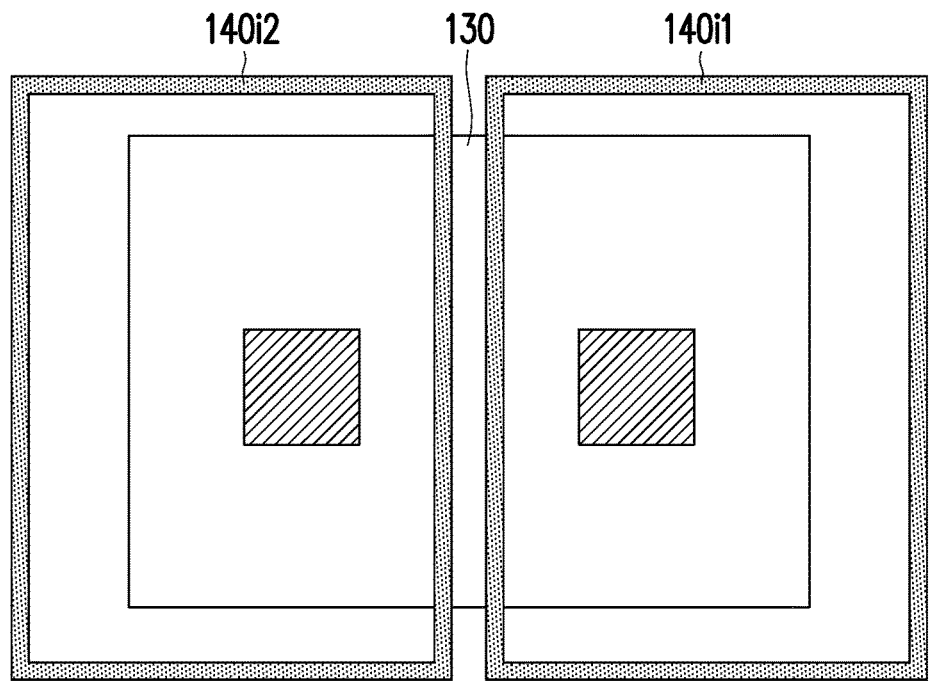

Referring to FIG. 4E, which is similar to FIG. 4D, the main difference therebetween is that two blocking walls 140i1 and 140i2 in FIG. 4E may extend beyond the light-emitting diode 130. That is to say, orthographic projections of both blocking walls 140i1 and 140i2 on the substrate 110 do not completely overlap the orthographic projection of the light-emitting diode 130 on the substrate 110.

Figure 5:
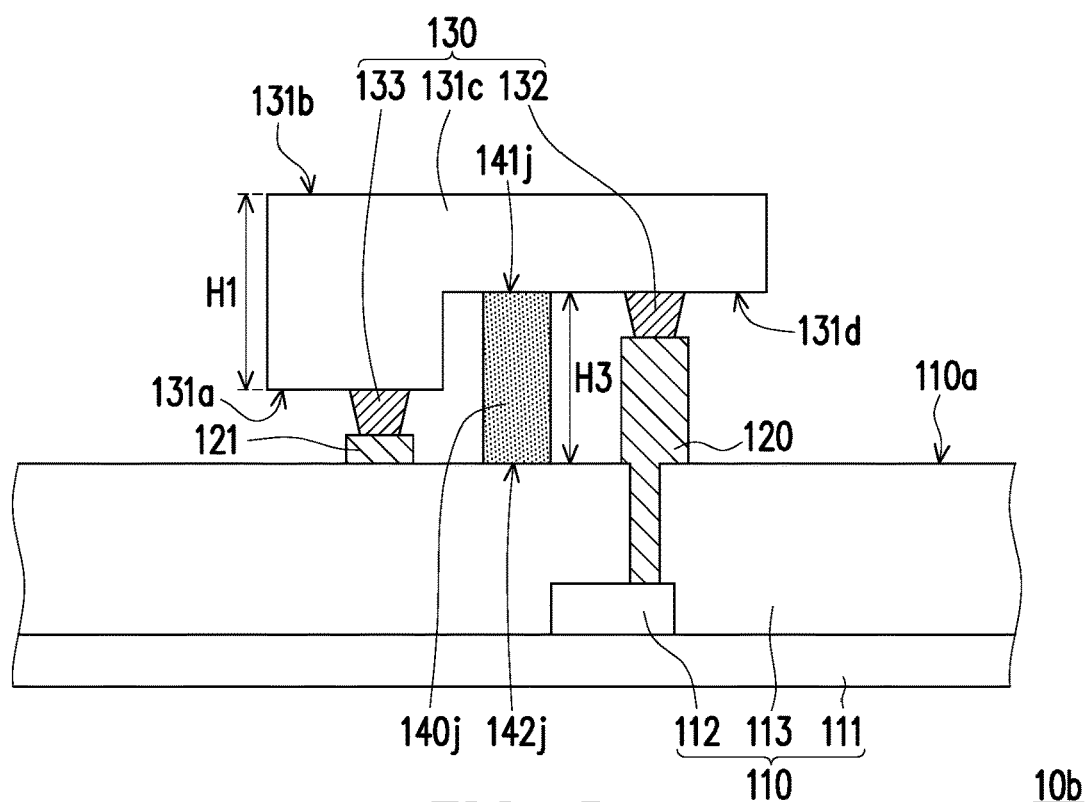
FIG. 5 is a schematic cross-sectional view of a light-emitting diode display according to another embodiment of the disclosure.

FIG. 5 is a schematic cross-sectional view of a light-emitting diode display according to another embodiment of the disclosure. Referring to FIG. 1B and FIG. 5 at the same time, a light-emitting diode display 10b of this embodiment is similar to the light-emitting diode display 10 in FIG. 1B, only the main difference between the two is as follows. A semiconductor stack 131c of the light-emitting diode display 10b of this embodiment further has a third surface 131d, and the first pad 132 is disposed on the third surface 131d of the semiconductor stack 131c. In this embodiment, a top surface 141j of a blocking wall 140j contacts the third surface 131d of the semiconductor stack 131c, and a height H3 of the blocking wall $140j \leq \frac{1}{2}$ a maximum thickness H1 of the semiconductor stack 131c. The maximum thickness H1 of the semiconductor stack 131c may be a vertical distance between a first surface 131a and a second surface 131b of the semiconductor stack 131c.

It is to be noted that, the blocking wall of each of the abovementioned embodiments are listed, according to the difficulty of implementation thereof, in a sequence from the easiest to the most difficult as follows: the blocking wall 140 in FIG. 1A=the blocking wall 140a in FIG. 3A>the blocking walls 140b in FIG. 3B=the blocking walls 140c1 and 140c2 in FIG. 3C=the blocking walls 140d1 and 140d2 in FIG. 3D>the blocking wall 140e in FIG. 4A=the blocking wall 140f of FIG. 4B>the blocking wall 140g of FIG. 4C=the blocking walls 140h1 and 140h2 of FIG. 4D=the blocking walls 140i1 and 140i2 of FIG. 4E.

In summary of the foregoing, in the light-emitting diode display of the embodiment of the disclosure, by disposing the blocking wall on the substrate and disposing the blocking wall between the first pad and the second pad, the first pad and the second pad on the light-emitting diode can be prevented from connection when bonded to the substrate which results in a short circuit. In this manner, the light-emitting diode display of the embodiments of the disclosure has greater reliability.

It will be apparent to any persons having ordinary in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode display having a plurality of sub-pixel regions, each of the sub-pixel regions comprising:
   a substrate having an active device;
   a first electrode and a second electrode separately disposed on the substrate, wherein the first electrode is electrically connected to the active device, and a horizontal distance between the first electrode and the second electrode is W1;
   a light-emitting diode disposed on the substrate, and comprising a semiconductor stack, a first pad, and a second pad, wherein the first pad and the second pad are separately disposed on the semiconductor stack, the first pad contacts the first electrode, the second pad contacts the second electrode, and a maximum thickness of the semiconductor stack is H1;
   at least one blocking wall disposed on the substrate, and located between the first pad and the second pad to prevent a contact between the first pad and the second pad, wherein a height of the at least one blocking wall is H2 and a width of the at least one blocking wall is W2,
   wherein H2≤½H1, and W2≤W1; and
   at least one spacer disposed on at least one side of the light-emitting diode, and located between adjacent ones of the sub-pixel regions, wherein the at least one spacer has reflective properties or absorptive properties.

2. The light-emitting diode display as described in claim 1, wherein the at least one blocking wall is located between the first electrode and the second electrode, and an orthographic projection of the at least one blocking wall on the substrate, an orthographic projection of the first electrode on the substrate, and an orthographic projection of the second electrode on the substrate do not overlap.

3. The light-emitting diode display as described in claim 1, wherein the at least one blocking wall is a plurality of blocking walls, and when the light-emitting diode display is viewed from above, a shape of each of the blocking walls comprises a solid strip shape, a hollow rectangle, a hollow triangle, a V shape, and a U shape.

4. The light-emitting diode display as described in claim 1, wherein an orthographic projection of the at least one blocking wall on the substrate extends beyond an orthographic projection of the light-emitting diode on the substrate.

5. The light-emitting diode display as described in claim 1, wherein when the light-emitting diode display is viewed from above, a shape of the at least one blocking wall comprises a solid strip shape, a hollow rectangle, a hollow triangle, a V shape, a U shape, and a B shape.

6. The light-emitting diode display as described in claim 5, wherein when the shape of the at least one blocking wall is a solid strip shape, a length of the at least one blocking wall is greater than a length of a short side of the light-emitting diode.

7. The light-emitting diode display as described in claim 5, wherein when the shape of the at least one blocking wall is a solid strip shape, a V shape, or a U shape, two ends of the at least one blocking wall are located outside the light-emitting diode.

8. The light-emitting diode display as described in claim 5, wherein when the shape of the at least one blocking wall is a hollow rectangle or a hollow triangle, the at least one blocking wall surrounds the first pad or the second pad.

9. The light-emitting diode display as described in claim 5, wherein when the shape of the at least one blocking wall is a V shape or a U shape, the at least one blocking wall partially surrounds the first pad or the second pad.

10. The light-emitting diode display as described in claim 5, wherein when the shape of the at least one blocking wall is a B shape, the at least one blocking wall comprises a first hollow region and a second hollow region, wherein the first pad is located in the first hollow region, and the second pad is located in the second hollow region.

* * * * *